`US009035227B2`

(12) United States Patent
Tanaka et al.

(10) Patent No.: US 9,035,227 B2
(45) Date of Patent: May 19, 2015

(54) SOLID-STATE IMAGING DEVICE WITH COLUMN CIRCUITRY INCLUDUNG A LATCH PART COMPRISING A PLURALITY OF LOGIC GATES AND SWITCH CIRCUITRY

(71) Applicant: OLYMPUS CORPORATION, Tokyo (JP)

(72) Inventors: Takanori Tanaka, Tokyo (JP); Susumu Yamazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 347 days.

(21) Appl. No.: 13/662,596

(22) Filed: Oct. 29, 2012

(65) Prior Publication Data
US 2013/0105665 A1    May 2, 2013

(30) Foreign Application Priority Data
Oct. 27, 2011    (JP) .................................. 2011-236021

(51) Int. Cl.
| H01L 27/00 | (2006.01) |
| H04N 5/335 | (2011.01) |
| H03M 1/34 | (2006.01) |
| H04N 5/376 | (2011.01) |

(Continued)

(52) U.S. Cl.
CPC ............. *H04N 5/3765* (2013.01); *H03M 1/502* (2013.01); *H03M 1/123* (2013.01); *H04N 5/378* (2013.01)

(58) Field of Classification Search
CPC ..... H04N 5/3765; H04N 5/378; H04N 5/335; H04N 5/3355; H04N 3/155; H03M 1/12; H03M 1/123; H03M 1/14; H03M 1/502; H03M 1/56; G01J 1/32; G01J 2001/444; G01J 1/44

USPC ................ 250/208.1, 214 R, 214 DC, 214 A; 348/222.1, 302, 241, 348, 300, 297, 348/294; 341/157, 155, 164, 165, 169, 170, 341/156

See application file for complete search history.

(56) References Cited

U.S. PATENT DOCUMENTS 5,689,257 A * 11/1997 Mercer et al. ................. 341/133
6,801,150 B2 * 10/2004 Honda ........................... 341/161

(Continued)

FOREIGN PATENT DOCUMENTS

| JP | 2009-38726 A | 2/2009 |
| JP | 2009-38781 A | 2/2009 |

(Continued)

OTHER PUBLICATIONS

Office Action dated Dec. 2, 2014, issued in Japanese Application No. 2011-236021; w/English translation. (4 pages).

Primary Examiner — Seung C Sohn
Assistant Examiner — Jennifer Bennett
(74) Attorney, Agent, or Firm — Westerman, Hattori, Daniels & Adrian, LLP

(57) ABSTRACT

In this solid-state imaging device, an output signal of any one of a plurality of delay units that output signals of logic states in accordance with a level of a pixel signal is input to an input terminal of a latch circuit that latches a logic state of the output signal. A NAND circuit and an INV circuit stop until a control signal output timing at which a control signal in accordance with the level of the pixel signal is output, and operate after the control signal output timing. A switch circuit outputs the output signal of the one of the plurality of delay units through a signal line from an output terminal until the control signal output timing, and switches a connection at a latch timing after a predetermined time elapses from the control signal output timing such that the NAND circuit and the INV circuit latch the logic state of the output signal of the one of the plurality of delay units.

10 Claims, 12 Drawing Sheets

(51) Int. Cl.
*H03M 1/50* (2006.01)
*H03M 1/12* (2006.01)
*H04N 5/378* (2011.01)

(56) References Cited

U.S. PATENT DOCUMENTS 6,850,178 B2 * 2/2005 Watanabe ............... 341/155

2011/0186713 A1 * 8/2011 Hagihara ............... 250/208.1

FOREIGN PATENT DOCUMENTS

| JP | 2011-019136 A | 1/2011 |
| JP | 2011-055196 A | 3/2011 |
| JP | 2011-146859 A | 7/2011 |

* cited by examiner

US 9,035,227 B2

SOLID-STATE IMAGING DEVICE WITH COLUMN CIRCUITRY INCLUDUNG A LATCH PART COMPRISING A PLURALITY OF LOGIC GATES AND SWITCH CIRCUITRY

BACKGROUND OF THE INVENTION

1. Field of the Invention

The present invention relates to a solid-state imaging device that has an A/D conversion function of converting an analog pixel signal output from a pixel into digital data.

Priority is claimed on Japanese Patent Application No. 2011-236021, filed on Oct. 27, 2011, the content of which is incorporated herein by reference.

2. Description of the Related Art

As an example of an A/D conversion circuit used in an existing solid-state imaging device, a configuration shown in FIG. 15 (for example, see Japanese Unexamined Patent Application, First Publication No. 2009-38726 and Japanese Unexamined Patent Application, First Publication No. 2009-38781) has been known. First, a configuration of an A/D conversion circuit shown in FIG. 15 will be described. The A/D conversion circuit shown in FIG. 15 includes a delay part 101, a comparison circuit 102, a latch part 103, a counter circuit 104, and a buffer circuit 105.

The delay part 101 has a plurality of delay units DU[0] to DU[7] that delay and output input signals. To the leading delay unit DU[0], a start pulse φStartP is input. To the comparison circuit 102, an analog signal φSignal that becomes a target from which a time is detected and a ramp wave φRamp that decreases with the elapse of time are input. The comparison circuit 102 outputs a signal φCO that represents a result of a comparison between the analog signal φSignal and the ramp wave φRamp. The latch part 103 has latch circuits L_0 to L_7 that latch logic states of output signals φCK0 to φCK7 of the respective delay units DU[0] to DU[7] in the delay part 101. The counter circuit 104 performs counting based on the output signal φCK7 of the delay unit DU[7] in the delay part 101.

By the comparison circuit 102, a time interval (size in a time-axis direction) in accordance with an amplitude of the analog signal φSignal is generated. The buffer circuit 105 is an inverting buffer circuit that inverts and outputs an input signal. To facilitate understanding of the description, the buffer circuit 105 is constituted as an inverting buffer circuit.

When an output signal φHold of the buffer circuit 105 is high, the latch circuits L_0 to L_7 constituting the latch part 103 are in an enable (valid) state and output the output signals if φCK0 to φCK7 of the delay units DU[0] to DU[7] as they are. When the output signal φHold of the buffer circuit 105 changes from High to Low, the latch circuits L_0 to L_7 are placed in a disable (invalid) state and latch logic states in accordance with the output signals φCK0 to φCK7 of the delay units DU[0] to DU[7] of the time.

In addition, a count latch circuit that latches a logic state of a count result of the counter circuit 104 is not specified, but a counter circuit having a latch function is used, such that the counter circuit 104 also serves as the count latch circuit.

Next, operation of the existing example will be described. FIG. 16 illustrates operation of the A/D conversion circuit according to the existing example. First, at a timing (first timing) related to the start of comparison by the comparison circuit 102, a clock having a period that approximately coincides with a delay time of the delay part 101 (the sum of delay times of the eight delay units DU[0] to DU[7]) is input to the delay part 101 as the start pulse φStartP. In this way, the delay part 101 starts operation. The delay unit DU[0] constituting the delay part 101 delays the start pulse φStartP and outputs as the output signal φCK0. The delay units DU[1] to DU[7] constituting the delay part 101 delay output signals of delay units in their front stages and output as the output signals φCK1 to φCK7. The output signals φCK0 to φCK7 of the delay units DU[0] to DU[7] are input to the latch circuits L_0 to L_7 of the latch part 103. The latch circuit L_7 outputs the input output signal φCK7 of the delay unit DU[7] to the counter circuit 104 as it is.

The counter circuit 104 performs a count operation based on the output signal φCK7 of the delay unit DU[7] output from the latch circuit L_7 of the latch part 103. In this count operation, a count value increases or decreases with rise or decay of the output signal φCK7. At a timing (second timing) at which the analog signal φSignal and the ramp wave φRamp approximately coincide with each other, the output signal φCO of the comparison circuit 102 is inverted. Also, at a timing (third timing) after a predetermined delay time given to an input signal in the buffer circuit 105 elapses, the output signal Hold of the buffer circuit 105 becomes Low.

In this way, the latch circuits L_0 to L_7 are placed in the disable state. At this time, logic states in accordance with the output signals φCK0 to φCK7 of the delay units DU[0] to DU[7] are latched in the latch circuits L_0 to L_7. The latch circuit L_7 stops operation, and thereby the counter circuit 104 latches the count value. From the logic states latched by the latch part 103 and the count value latched by counter circuit 104, digital data corresponding to the analog signal φSignal is obtained.

By the A/D conversion circuit according to the existing example, digital data corresponding to a time interval in accordance with a voltage of the analog signal φSignal is obtained. In other words, digital data corresponding to the analog signal φSignal is obtained.

In the existing A/D conversion circuit, the latch circuits L_0 to L_7 constituting the latch part 103 operate for the period of the time interval, and thus a current value consumed by the latch part 103 becomes large.

In the A/D conversion circuit of the existing example, the latch circuits L_0 to L_7 constituting the latch part 103 continuously operate for a period of time from the first timing to the third timing. The output signals φCK0 to φCK7 of the delay part 101 have high frequencies in general. For this reason, the current value consumed by the latch part 103 becomes high due to current consumed by the latch circuits L_0 to L_7 constituting the latch part 103.

Here, as an example of a concrete device used in the A/D conversion circuit of the existing example, an imager used in a digital still camera (DSC) and the like is considered. Specifically, it is assumed that specifications are the number of pixels of 20,000,000 and a frame rate of 60 frame/sec. The A/D conversion circuit is disposed in every pixel column. To facilitate description, an arrangement of the 20,000,000 pixels is assumed to be 4000 rows×5000 columns vertically and horizontally, and to further facilitate description, it is assumed that there is no blanking period. Then, the number of rows that read a pixel signal per second becomes is described below.

60 frame/sec×4000 row/frame=240 Kline/sec

In other words, the read rate for one row becomes 240 KHz. For example, assuming that AD conversion of 10 bits is configured with upper seven bits (the count value of the counter circuit 104) and lower three bits (the data of the latch circuits L_0 to L_7 constituting the latch part 103), the output signals φCK0 to φCK7 are necessary to be output from the delay part 101 at 128 ($=2^7$) times the read rate for one row, in other words, at about 30 MHz. Here, assuming that a current consumption value per one latch circuit constituting the latch part 103 is 1 μA/latch circuit, a current consumption value of the latch circuits L_0 to L_7 per one column is 1 μA/latch circuit×8 latch circuits=8 μA.

That is, a current consumption value of the 5000 columns becomes 40 mA. Since, in this calculation, a period for which a comparison operation is not possible as AD conversion, such as a standby period until the A/D conversion circuit receives data from a pixel, and the like, is not taken into consideration, and also a period for reading a pixel signal from an Optical Black (OB) pixel other than the pixels or a blanking period is excluded, it is considered in practice that a frequency becomes higher than the frequency of 30 MHz estimated as mentioned above.

SUMMARY OF THE INVENTION

According to a first aspect of the present invention, a solid-state imaging device includes: a pixel part in which a plurality of pixels outputting a pixel signal according to an intensity of an input electromagnetic wave are arranged in the shape of a matrix; a delay part which has a plurality of delay units delaying and outputting an input signal; a count part which performs counting based on a clock output from any one of the plurality of delay units, and latches a count result; a latch control part which outputs a control signal at a timing at which a number of input signals passing through the plurality of delay units becomes a number in accordance with the level of the pixel signal; and a latch part which latches a logic state of an output signal of any one of the plurality of delay units. The latch part includes: a first logic gate which is connected to the one of the plurality of delay units, and performs a logical operation on the output signal of the one of the plurality of delay units; a second logic gate which stops until the control signal output timing at which the control signal is output, and performs a logical operation on an output signal of the first logic gate after the control signal output timing and outputs a result of the logical operation to the first logic gate; a signal output line which connects an input terminal or an output terminal of the first logic gate with the count part; and a switch circuit which outputs the output signal of the one of the plurality of delay units to the count part through the signal output line until the control signal output timing, and switches a connection at a latch timing after a predetermined time elapses from the control signal output timing such that the first logic gate and the second logic gate latch the logic state of the output signal of the one of the plurality of delay units. The delay part, the count part, the latch control part, and the latch part are disposed in each column or each of a plurality of columns of pixels constituting the pixel part.

According to a second aspect of the present invention, in the solid-state imaging device, the first logic gate may be constituted by a NAND circuit and stop until the control signal output timing. The second logic gate may be constituted by an inverter circuit, and the signal output line may be connected to the input terminal of the first logic gate.

According to a third aspect of the present invention, in the solid-state imaging device, the first logic gate may be constituted by an inverter circuit. The second logic gate may be constituted by a NAND circuit. The signal output line may be connected to the output terminal of the first logic gate.

According to a fourth aspect of the present invention, in the solid-state imaging device, the first logic gate may be constituted by a NOR circuit and stop until the control signal output timing. The second logic gate may be constituted by an inverter circuit. The signal output line may be connected to the input terminal of the first logic gate.

According to a fifth aspect of the present invention, in the solid-state imaging device, the first logic gate may be constituted by an inverter circuit. The second logic gate may be constituted by a NOR circuit. The signal output line may be connected to the output terminal of the first logic gate.

According to a sixth aspect of the present invention, in the solid-state imaging device in any one aspect among the first aspect to the fifth aspect of the present invention, the switch circuit may include a first switch of which one end is connected to an input terminal of the latch part and of which the other end is connected to the input terminal of the first logic gate, and a second switch of which one end is connected to the input terminal of the first logic gate and of which the other end is connected to an output terminal of the second logic gate.

According to a seventh aspect of the present invention, in the solid-state imaging device according to the sixth aspect of the present invention, the switch circuit may further include a switch control circuit which controls the second switch to connect the input terminal of the first logic gate with the output terminal of the second logic gate after a predetermined time elapse after the first switch opens a connection between the input terminal of the latch part and the input terminal of the first logic gate.

According to an eighth aspect of the present invention, the solid-state imaging device according to any one aspect among the first aspect to the seventh aspect of the present invention may further include a buffer having a hysteresis characteristic between an output terminal of the latch part and an input terminal of the count part.

According to a ninth aspect of the present invention, in the solid-state imaging device according to the third aspect or the fifth aspect of the present invention, the inverter circuit may have a hysteresis characteristic.

DETAILED DESCRIPTION OF THE INVENTION

Hereinafter, embodiments of the present invention will be described with reference to the drawings.

First Embodiment

Figure 1:
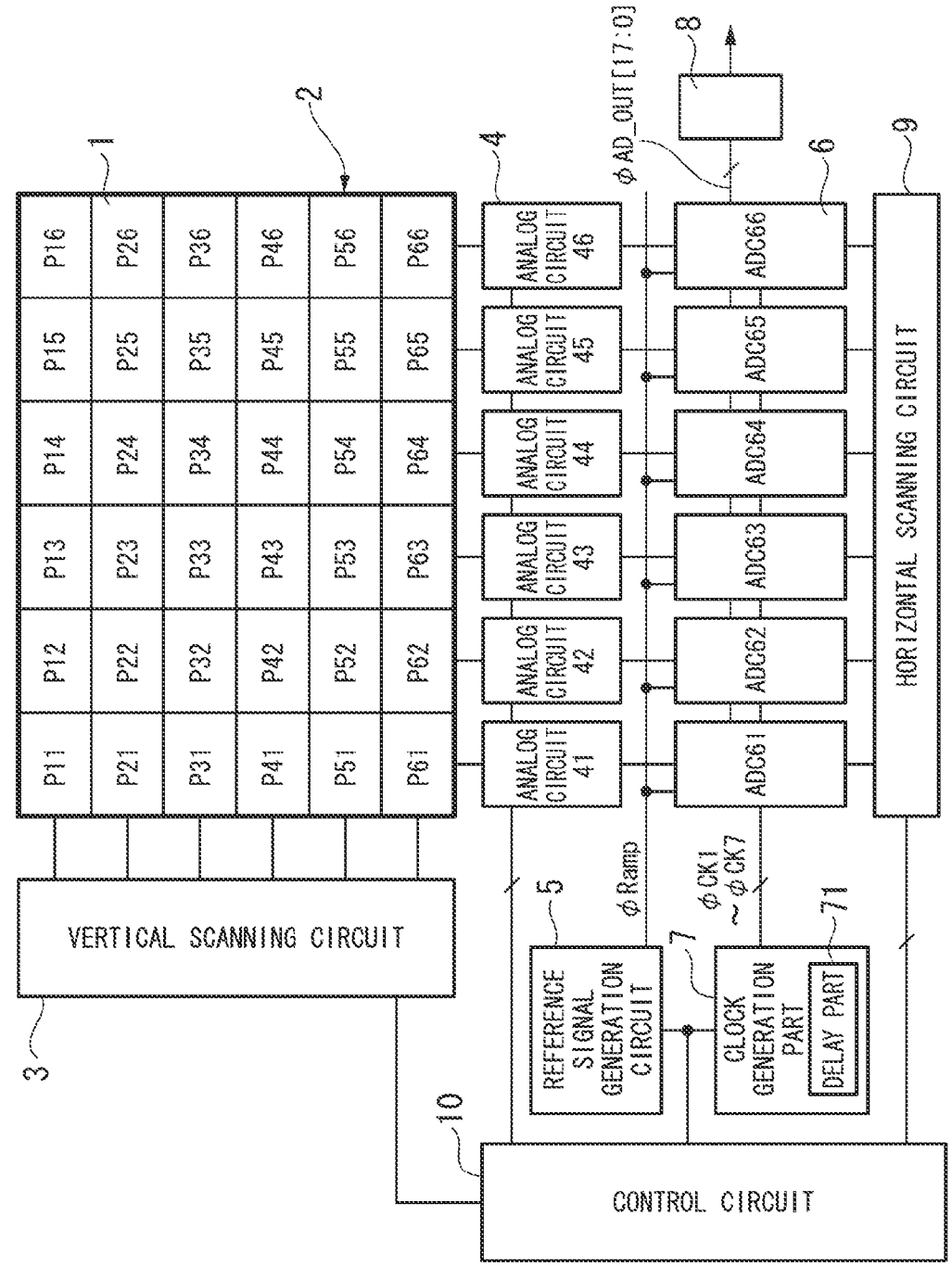
FIG. 1 is a block diagram showing a configuration of a solid-state imaging device according to a first embodiment of the present invention.

First, a first embodiment of the present invention will be described. FIG. 1 shows a configuration of a solid-state imaging device according to this embodiment. The solid-state imaging device shown in FIG. 1 is constituted by a pixel array 2 (pixel part) having unit pixels 1, a vertical scanning circuit 3, analog circuits 4 (an analog circuit 41, an analog circuit 42, an analog circuit 43, an analog circuit 44, an analog circuit 45, and an analog circuit 46), a reference signal generation circuit 5, A/D conversion circuits 6, a clock generation part 7, an encoder circuit 8, a horizontal scanning circuit 9, and a control circuit 10.

The unit pixels 1 have at least photoelectric conversion elements, and output pixel signals in accordance with intensity of an input electromagnetic wave. The pixel array 2 is constituted by the unit pixels 1 disposed in a two dimension (six rows and six columns in the shown example). The vertical scanning circuit 3 is constituted by a shift register, a decoder, or the like, and selects a row of the pixel array 2. The analog circuits 4 are constituted by so-called CDS circuits and the like. The analog circuits 4 process and output the pixel signals that have been read from the pixel array 2. The reference signal generation circuit 5 generates a reference signal (ramp wave) that increases or decreases with the elapse of time The clock generation part 7 is constituted by a delay part 71. The A/D conversion circuits 6 convert the analog pixel signals that have been read from the unit pixels 1 through the analog circuits 4 into digital data, and output the digital data that has been subjected to the conversion as output signals φAD_OUT. The encoder circuit 8 binarizes and outputs the output signals φAD_OUT of the A/D conversion circuits 6. The horizontal scanning circuit 9 is constituted by a shift register, a decoder, or the like. The horizontal scanning circuit 9 controls the A/D conversion circuits 6 to output the digital data that the A/D conversion circuits 6 hold to the respective columns. The control circuit 10 outputs a variety of control signals to the respective circuits constituting the solid-state imaging device.

Figure 2A:
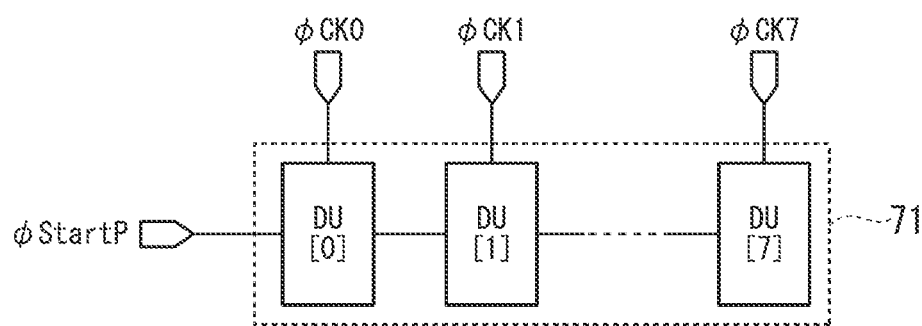
FIG. 2A is a block diagram showing a configuration of a delay part of a solid-state imaging device according to the first embodiment of the present invention.

FIG. 2A shows a configuration of the delay part 71. The delay part 71 has a plurality of delay units DU[0] to DU[7] that delay and output an input signal. The delay units DU[0] to DU[7] are connected in series in order of the delay unit DU[0], the delay unit DU[1], the delay unit DU[2], ..., and the delay unit DU[7], and a start pulse φStartP is input to the leading delay unit DU[0]. The delay unit DU[0] delays and outputs the input start pulse φStartP, and the delay units DU[1] to DU[7] delay and output signals of delay units in their front stages.

Figure 2B:
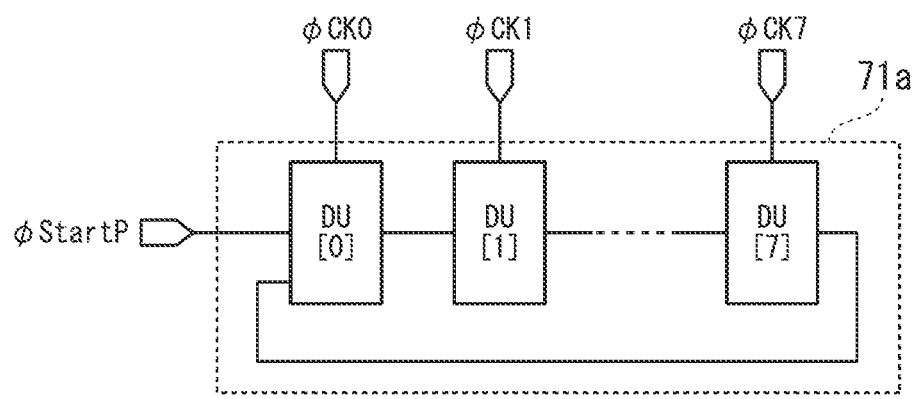
FIG. 2B is a block diagram showing a configuration of a delay part of a solid-state imaging device according to the first embodiment of the present invention.

Instead of the configuration shown in FIG. 2A, an annular delay circuit (a delay part 71a) implemented by connecting the plurality of delay unit DU[0] to DU[7] in a ring shape may be used as the delay part 71. FIG. 2B shows a configuration of the delay part 71a. In the delay part 71a, an output signal of the delay unit DU[7] is input to the delay unit DU[0]. A logic state of the start pulse φStartP changes from Low to High, and thus the delay part 71a starts operation.

Figure 3:
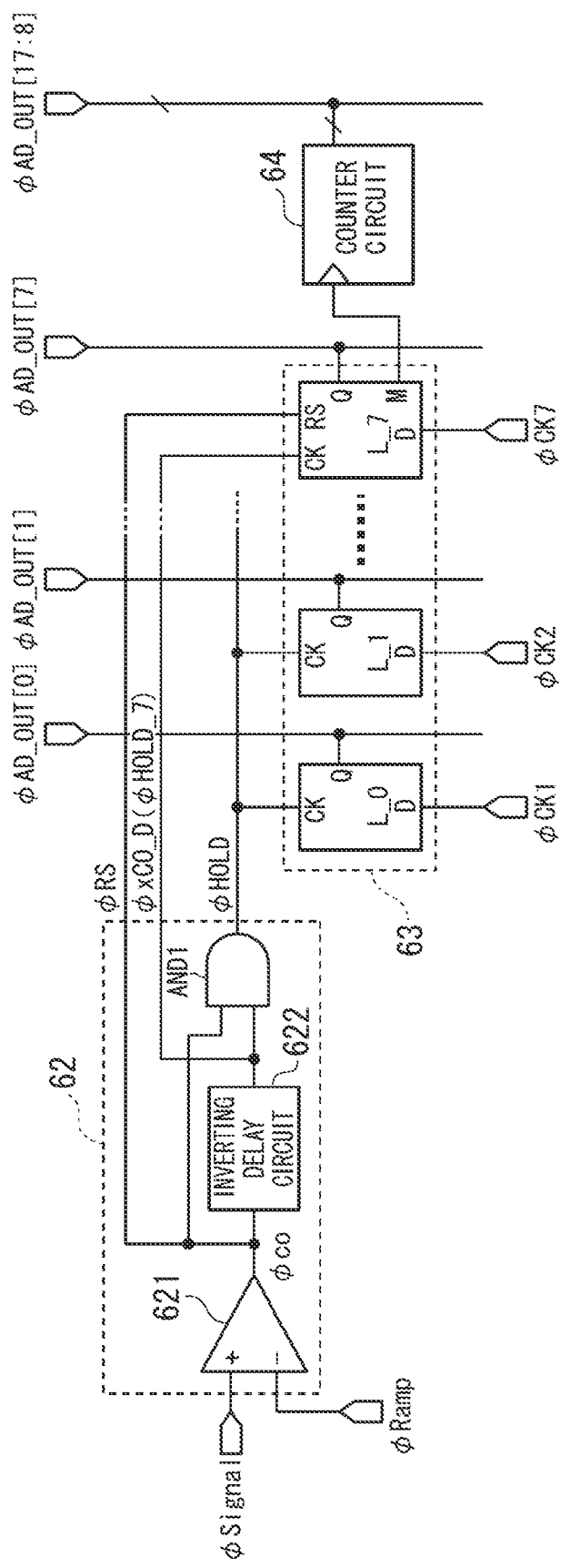
FIG. 3 is a block diagram showing a configuration of an A/D conversion circuit of a solid-state imaging device according to the first embodiment of the present invention.

Next, a configuration of the A/D conversion circuits 6 will be described. The A/D conversion circuits 6 are installed in respective pixel columns. In FIG. 1, six A/D conversion circuits 6 (ADC61, ADC62, ADC63 ADC64, ADC65 and ADC66) are installed. The A/D conversion circuits 6 of the respective columns have the same configuration. FIG. 3 shows a configuration of the A/D conversion circuits 6. The A/D conversion circuits 6 are constituted by a latch control part 62, a latch part 63, and a counter circuit 64 (a count part).

The latch control part 62 is constituted by a comparison circuit 621, an inverting delay circuit 622, and an AND circuit AND1. The latch control part 62 generates control signals (φRS, φxCO_D, and ΦHOLD) for controlling the latch part 63 based on an output signal φCO of the comparison circuit 621. The comparison circuit 621 compares a signal voltage in accordance with an analog pixel signal φSignal output from a unit pixel 1 through an analog circuit 4 with a signal voltage in accordance with the ramp wave φRamp supplied from the reference signal generation circuit 5, and thereby converts an intensity of the pixel signal φSignal into a time interval (pulse width) that is an information along a time-axis direction. The output signal φCO, which is a comparison output of the comparison circuit 621, becomes a low level, for example, when the signal voltage in accordance with the ramp wave φRamp becomes higher than the signal voltage in accordance with the pixel signal φSignal, and becomes a high level when the signal voltage in accordance with the ramp wave φRamp is equal to or lower than the signal voltage in accordance with the pixel signal φSignal.

The output signal φCO of the comparison circuit 621 is output to the inverting delay circuit 622 and the AND circuit AND1 and also is output to the latch part 63 as an output signal φRS. The inverting delay circuit 622 inverts and delays the output signal φCO of the comparison circuit 621. An output signal φxCO_D of the inverting delay circuit 622 is output to the AND circuit AND1 and also is output to the latch part 63 as an output signal φHOLD_7. The AND circuit AND1 outputs a signal obtained by taking a logical product (AND) of the output signal φCO of the comparison circuit 621 and the output signal φxCO_D of the inverting delay circuit 622 to the latch part 63 as an output signal φHOLD.

The latch part 63 has latch circuits L_0 to L_6 and a latch circuit L_7. At a timing (second timing) at which the output signal φCO of the comparison circuit 621 in the latch control part 62 is inverted after a timing (first timing) at which the start pulse φStartP is input to the delay part 71, the latch circuits L_0 to L_6 of the latch part 63 are placed in an enable (valid) state. At a timing (third timing) after a predetermined time elapses from the second timing, the latch circuits L_0 to L_7 of the latch part 63 are placed in a disable (invalid) state, and latches (holds/stores) a logic state of a signal generated in the delay part 71. The latch circuit L_7 of the latch part 63 is continuously in the enable state until the third timing.

The counter circuit 64 performs counting based on an output signal of an output terminal M of the latch circuit L_7 in the latch part 63. In this embodiment, the counter circuit 64 is a counter circuit that also has a latch function of holding a logic state of the counter circuit 64. A lower data signal represented by a logic state of the latch part 63 is, for example, 8-bit data. Also, an upper data signal representing a count result of the counter circuit 64 is, for example, 10-bit data. Here, the 10-bit data is an example, and the number of bits may be less than 10 bits (for example, 8 bits) or greater than 10 bits (for example, 12 bits).

Figure 4A:
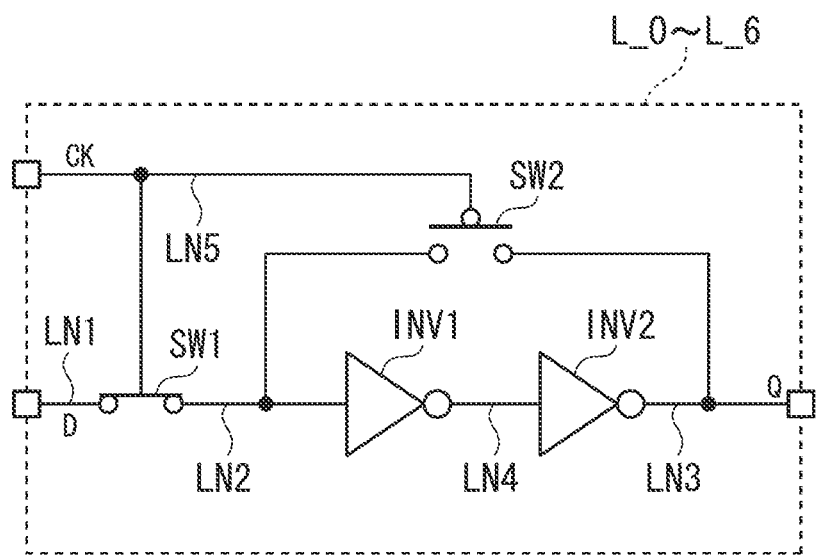
FIG. 4A is a circuit diagram showing a configuration of a latch circuit of the A/D conversion circuit of a solid-state imaging device according to the first embodiment of the present invention.
Figure 4B:
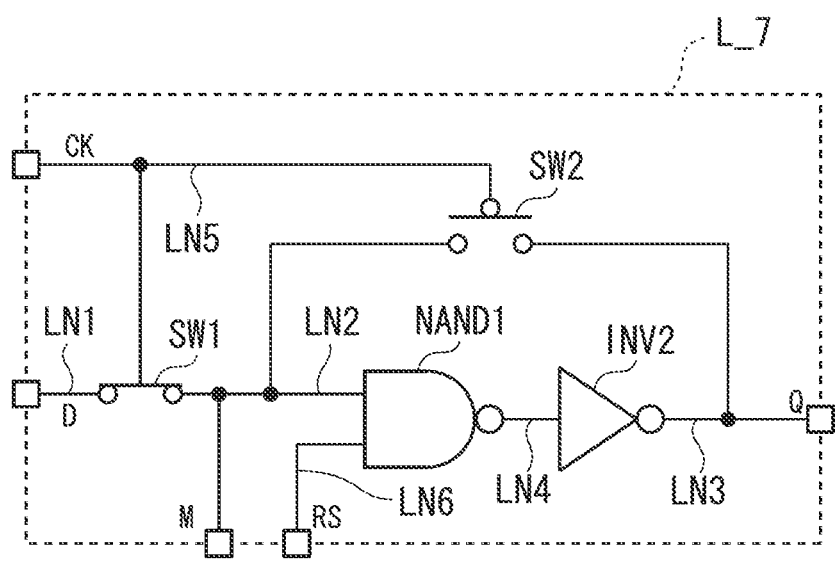
FIG. 4B is a circuit diagram showing a configuration of a latch circuit of the A/D conversion circuit of a solid-state imaging device according to the first embodiment of the present invention.

FIG. 4 shows configurations of the latch circuits L_0 to L_6 and the latch circuit L_7. FIG. 4A shows a configuration of the latch circuits L_0 to L_6. FIG. 4B shows a configuration of the latch circuit L_7.

The latch circuits L_0 to L_6 are constituted by switch circuits SW1 and SW2, and INV circuits (inverter circuits) INV1 and INV2. One end of the switch circuit SW1 is connected to an input terminal D through a signal line LN1. One end of the switch circuit SW2 and an input terminal of the INV circuit INV1 are connected to the other end of the switch circuit SW1 through a signal line LN2. An input terminal of the INV circuit INV2 is connected to an output terminal of the INV circuit INV1 through a signal line LN4. The other end of the switch circuit SW2 and an output terminal of the INV circuit INV2 are connected to an output terminal Q through a signal line LN3.

Control terminals of the switch circuits SW1 and SW2 are connected to an input terminal CK through a signal line LN5, such that the switch circuits SW1 and SW2 are controlled by an input signal of the input terminal CK. The switch circuit SW1 turns ON when the input signal of the input terminal CK is High, and turns OFF when the input signal of the input terminal CK is Low. The switch circuit SW2 turns ON when the input signal of the input terminal CK is Low, and turns OFF when the input signal of the input terminal CK is High. The INV circuits INV1 and INV2 output signals obtained by inverting logic states of input signals.

The signal that is input to the input terminal CK is the output signal φHOLD of the latch control part 62. Signals that are input to the input terminal D are output signals φCK0 to φCK6 of the delay units DU[0] to DU[6] constituting the delay part 71. Signals output from the output terminal Q constitute output signals φAD_OUT[0] to φAD_OUT[6].

The latch circuits L_0 to L_6 are placed in the enable state when the input signal of the input terminal CK is High, and output the input signals of the input terminals D as they are from the output terminals Q as the output signals. Also, when the input signal of the input terminal CK changes from High to LOW, the latch circuits L_0 to L_6 are placed in the disable state, and latch logic states of the input signals of the input terminal D.

The latch circuit L_7 is constituted by switch circuits SW1 and SW2 (switch circuits), a NAND circuit NAND1 (first logic gate), and an INV circuit (inverter circuit) INV2 (second logic gate). One end of the switch circuit SW1 is connected to an input terminal D through a signal line LN1. One end of the switch circuit SW2 and a first input terminal of the NAND circuit NAND1 is connected to the other end of the switch circuit SW1 and an output terminal M through a signal line LN2 (signal output line). A second input terminal of the NAND circuit NAND1 is connected to an input terminal RS. An input terminal of the INV circuit INV2 is connected to an output terminal of the NAND circuit NAND1 through a signal line LN4. The other end of the switch circuit SW2 and an output terminal of the INV circuit INV2 are connected to an output terminal Q through a signal line LN3.

Control terminals of the switch circuits SW1 and SW2 are connected to an input terminal CK through a signal line LN5. The switch circuits SW1 and SW2 are controlled by an input signal of the input terminal CK. The switch circuit SW1 turns ON when the input signal of the input terminal CK is High, and turns OFF when the input signal of the input terminal CK is Low. The switch circuit SW2 turns ON when the input signal of the input terminal CK is Low, and turns OFF when the input signal of the input terminal CK is High. The NAND circuit NAND1 outputs a signal obtained by taking a negative logical product (NAND) of a signal that is input to the first input terminal and a signal that is input to the second input terminal. The INV circuit INV2 outputs a signal obtained by inverting a logic state of the input signal.

The signal that is input to the input terminal CK is the output signal φHOLD_7 of the latch control part 62. A signal that is input to the input terminal D is an output signal φCK7 of the delay unit DU[7] constituting the delay part 71. Also, a signal that is input to the input terminal RS is the output signal φRS of the latch control part 62. A signal that is output from the output terminal Q constitutes an output signal φAD_OUT[7]. Also, a signal that is output from the output terminal M is input to the counter circuit 64 as a count clock of the counter circuit 64.

When the input signal of the input terminal CK is High, the latch circuit L_7 is placed in the enable state, and outputs the input signal of the input terminal D as it is from the output terminal M as the output signal. Also, when the input signal of the input terminal CK changes from High to Low, the latch circuit L_7 is placed in the disable state, and latches a logic state of the input signal of the input terminal D. The latched input signal is output from the output terminal Q as the output signal. When the input signal of the input terminal RS becomes Low, the logic elements (the NAND circuit NAND1 and the INV circuit INV2) of the logic latch circuit L_7 stop operation.

When the input signal of the input terminal CK is High, the switch circuit SW1 turns ON, such that the output signal φCK7 of the delay unit DU[7] in the delay part 71 is input to the first input terminal of the NAND circuit NAND1 and is also output to the counter circuit 64 from the output terminal M. At this time, by determining the input signal of the input terminal RS input to the second input terminal of the NAND circuit NAND1 to be Low, even if the output signal φCK7 of the delay unit DU[7] is input to the NAND circuit NAND1, operation of the NAND circuit NAND1 and the INV circuit INV2 can be stopped, and power consumption can be reduced.

Figure 5:
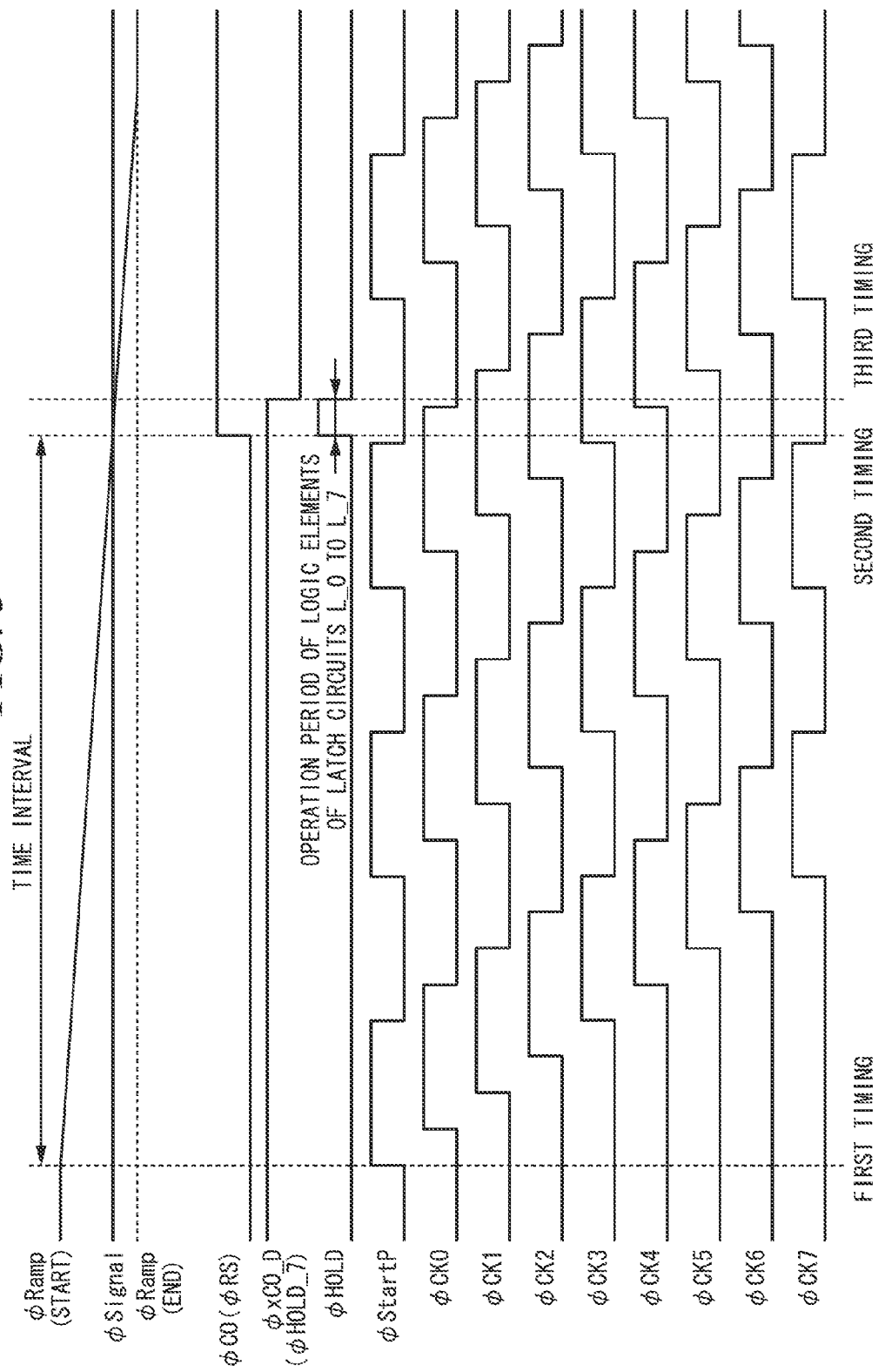
FIG. 5 is a timing chart illustrating operation of the A/D conversion circuit of a solid-state imaging device according to the first embodiment of the present invention.

Next, operation of the A/D conversion circuits 6 according to this embodiment will be described. Although the description of detailed operation of the unit pixels 1 is omitted here, reset levels and signal levels are output from the unit pixels 1 as well known in the art. The output reset levels and signal levels are output as pixel signals φSignal that have been subjected to a CDS process in the analog circuits 4. A/D conversion is performed as follows. FIG. 5 shows operation of the A/D conversion circuits 6 according to this embodiment.

First, at the timing (first timing) related to the start of comparison by the comparison circuit 621 of the latch control part 62, a clock having a period that approximately coincides with a delay time of the delay part 71 of the clock generation part 7 is input as the start pulse φStartP. In this way, the delay part 71 starts operation. The delay unit DU[0] constituting the delay part 71 delays the start pulse φStartP and outputs as the output signal φCK0, and the delay units DU[1] to DU[7] constituting the delay part 71 respectively delay and output signals of delay units in their front stages as the output signals φCK1 to φCK7.

The output signals φCK0 to φCK7 of the delay units DU[0] to DU[7] are input to the latch circuits L_0 to L_7 of the latch part 63. Since the output signal φCO of the comparison circuit 621 in the latch control part 62 is Low, and the output signal φHOLD of the latch control part 62 is Low, the latch circuits L_0 to L_6 are in the disable state and have stopped operation. Since the output signal φHOLD_7 of the latch control part 62 is High, the latch circuit L_7 is in the enable state, and outputs the output signal φCK7 of the delay unit DU[7] as it is from the output terminal M as the output signal.

At this time, since the output signal φRS of the latch control part 62 (=the output signal φCO of the comparison circuit 621) is Low, the logic elements (the NAND circuit NAND1 and the INV circuit INV2) of the logic latch circuit L_7 have stopped operation. The counter circuit 64 performs a count operation based on the output signal φCK7 of the delay part 71 that is output from the output terminal M of the latch circuit L_7. In this count operation, a count value increases or decreases with rise or decay of the output signal φCK7.

While the signal voltage in accordance with the ramp wave φRamp is higher than the signal voltage in accordance with the pixel signal φSignal after the first timing, the output signal φCO of the comparison circuit 621 in the latch control part 62 is Low. When the signal voltage in accordance with the ramp wave φRamp becomes equal to or lower than the signal voltage in accordance with the pixel signal φSignal, the output signal φCO of the comparison circuit 621 in the latch control part 62 becomes High. A period of time from the first timing until the output signal φCO of the comparison circuit 621 in the latch control part 62 becomes High is a time interval that becomes a target for detection. A number of the start pulse φStartP passing through the delay units DU[0] to DU[7] constituting the delay part 71 during this time period is a number in accordance with a level of the pixel signal φSignal.

After the time interval, which becomes the detection target, elapses from the first timing, the output signal φCO of the comparison circuit 621 in the latch control part 62 is inverted, such that the output signal φHOLD of the latch control part 62 becomes High (the second timing). In this way, the latch circuits L_0 to L_6 are placed in the enable state. At this time, the output signal φRS of the latch control part 62 (the output signal φCO of the comparison circuit 621) becomes High. In this way, the logic elements (the NAND circuit NAND1 and the INV circuit INV2) of the latch circuit L_7 start operation.

After a time that coincides with a delay time of the inverting delay circuit 622 in the latch control part 62 elapses from the second timing (the third timing), the output signal φxCO_D of the inverting delay circuit 622 in the latch control part 62 is inverted, such that the output signals φHOLD and φHOLD_7(φxCO_D) of the latch control part 62 become Low. In this way, the latch circuits L_0 to L_7 are placed in the disable state. At this time, logic states in accordance with the output signals φCK0 to φCK7 of the delay units DU[0] to DU[7] are latched in the latch circuits L_0 to L_7 of the latch part 63.

The latch circuit L_7 stops operation, and thus the counter circuit 64 latches a count value.

From the logic states held by the latch part 63 and the count value held by the counter circuit 64, data corresponding to the time interval is obtained.

After that, the digital data latched by the latch circuits L_0 to L_7 and the counter circuit 64 is output through a horizontal signal line by the horizontal scanning circuit 9, and transmitted to the encoder circuit 8.

The encoder circuit 8 performs a binarization process, and thus binary data is obtained. Here, the encoder circuit 8 may be built in the A/D conversion circuits 6.

In the aforementioned operation, since the logic elements (the inverter circuits INV1 and INV2, and the NAND circuit NAND1) of the latch circuits L_0 to L_7 operate only for a period of time from the second timing (control signal output timing) to the third timing (latch timing), it is possible to reduce power consumption of the latch part 63. Consequently, according to this embodiment, it is possible to implement a solid-state imaging device the power consumption of which is reduced.

In this embodiment, by A/D-converting a signal level of a pixel signal that has been analogically subjected to a CDS process, the solid-state imaging device operates to obtain digital data in accordance with the pixel signal, but operation of the solid-state imaging device is not limited to this operation. For example, during a first read operation, a reset level including noise of a pixel signal is read from a unit pixel 1 and A/D-converted. Subsequently, during a second read operation, a signal level is read from the unit pixel 1 and A/D-converted. After that, a CDS operation is digitally performed. By the aforementioned operation, digital data in accordance with the pixel signal may be obtained. Also, operation of the solid-state imaging device is not limited to this.

Figure 6:
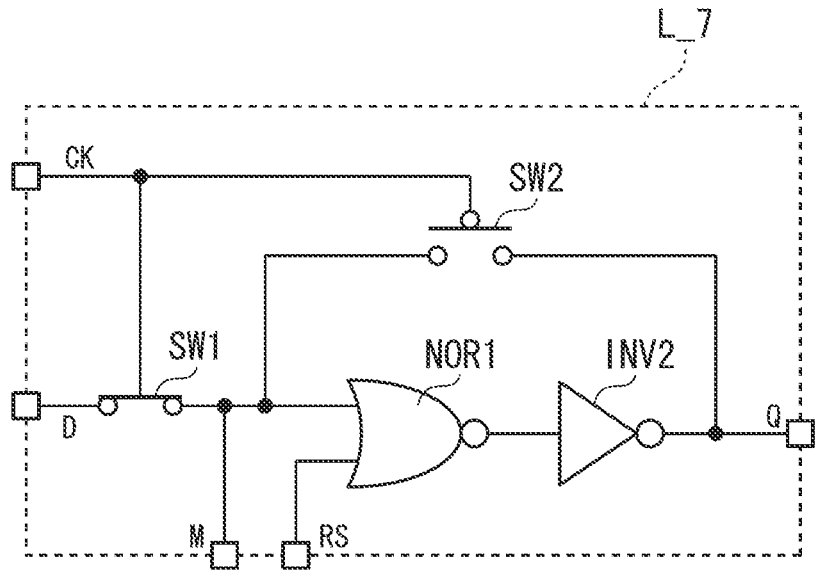
FIG. 6 is a circuit diagram showing a configuration of a latch circuit of the A/D conversion circuit of a solid-state imaging device according to the first embodiment of the present invention.

In addition, a configuration of the latch circuits L_0 to L_6 in the A/D conversion circuit 6 is not limited to the configuration of FIG. 4A, and may be a circuit that latches an input signal of the input terminal D according to an input signal of the input terminal CK. Also, a configuration of the latch circuit L_7 is not limited to the configuration of FIG. 4B, and may employ a NOR circuit NOR1 instead of the NAND circuit NAND1 as shown in FIG. 6.

Second Embodiment

Figure 7:
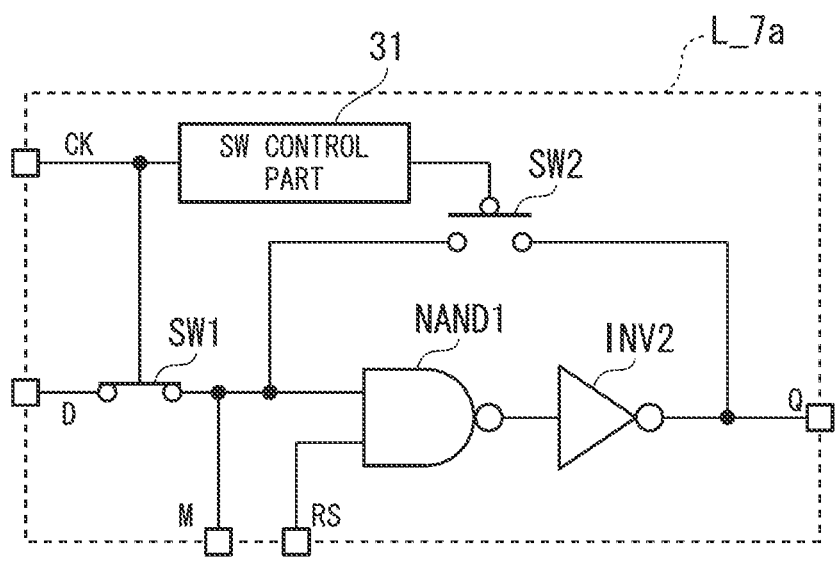
FIG. 7 is a circuit diagram showing a configuration of a latch circuit of an A/D conversion circuit of a solid-state imaging device according to a second embodiment of the present invention.

Next, a second embodiment of the present invention will be described. FIG. 7 shows a configuration of a latch circuit L_7 (latch circuit L_7a) of an A/D conversion circuit 6 according to this embodiment. Since this embodiment is the same as the first embodiment except for the configuration of the latch circuit L_7a constituting the A/D conversion circuit 6, a description thereof will be omitted here.

The latch circuit L_7a shown in FIG. 7 differs from the latch circuit L_7 of FIG. 4B in that a SW control part 31 (switch control circuit) which controls a latch operation of the latch circuit L_7a is installed. Except for this, the configuration is the same as the configuration of the latch circuit L_7 of FIG. 4B. At a timing at which a predetermined time elapses after a switch circuit SW1 switches from ON to OFF, the SW control part 31 performs a control of switching a switch circuit SW2 from OFF to ON. The SW control part 31 is constituted by, for example, a delay circuit.

Figure 8:
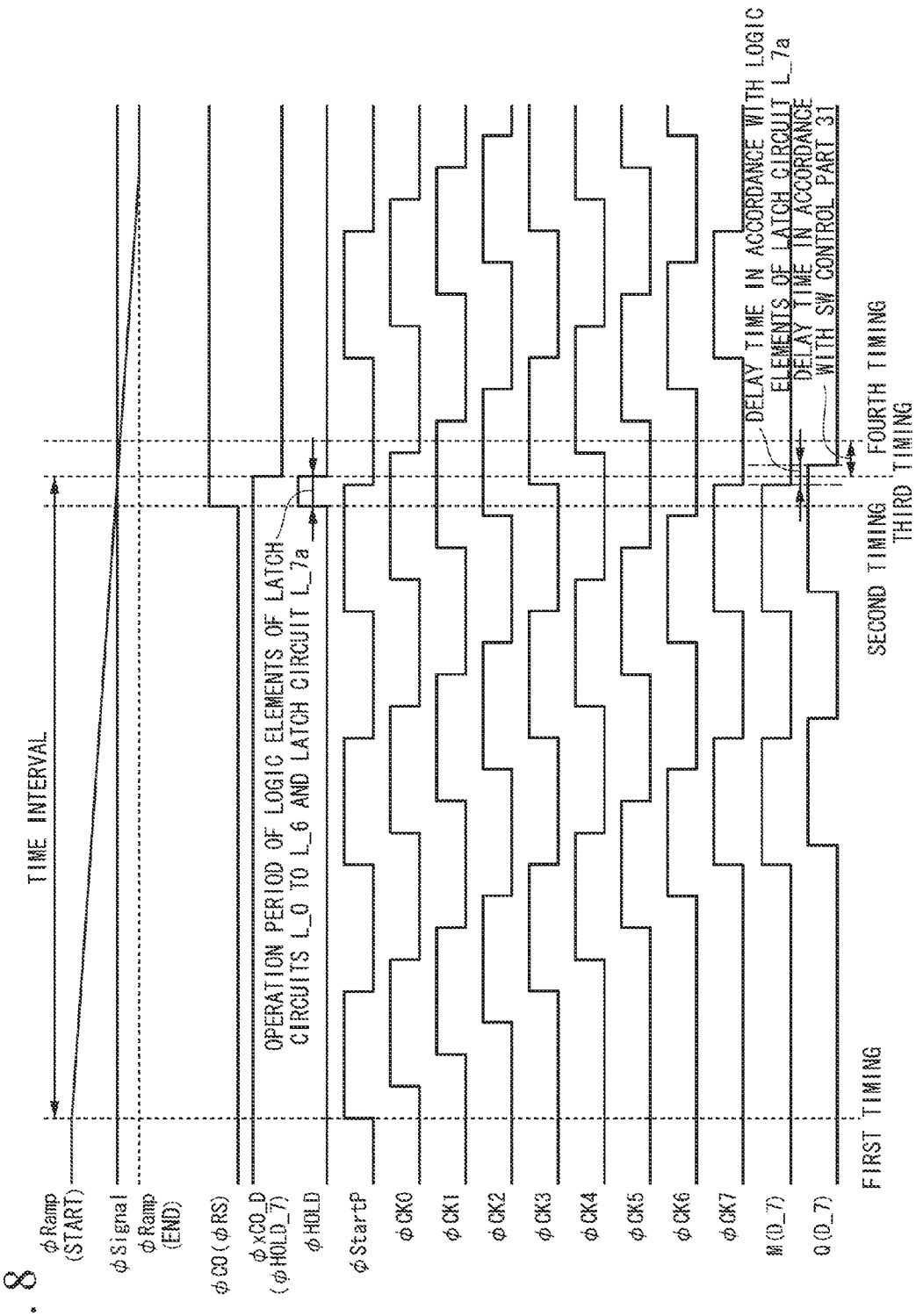
FIG. 8 is a timing chart illustrating operation of the A/D conversion circuit of a solid-state imaging device according to the second embodiment of the present invention.

Next, operation of the A/D conversion circuit 6 according to this embodiment will be described. Except for operation of the A/D conversion circuit 6, since this embodiment is the same as the first embodiment, a description thereof will be omitted here. FIG. 8 illustrates operation of the A/D conversion circuit 6 according to this embodiment. First, at a timing (first timing) related to the start of comparison by a comparison circuit 621 of a latch control part 62, a clock having a period that approximately coincides with a delay time of a delay part 71 of a clock generation part 7 is input as a start pulse φStartP. In this way, the delay part 71 starts operation. A delay unit DU[0] constituting the delay part 71 delays the start pulse φStartP and outputs as an output signal φCK0. Delay units DU[1] to DU[7] constituting the delay part 71 respectively delay output signals of delay units in their front stages and output as output signals φCK1 to φCK7.

The output signals φCK0 to φCK7 of the delay units DU[0] to DU[7] are input to latch circuits L_0 to L_6 and the latch circuit L_7a of a latch part 63. Since an output signal φCO of the comparison circuit 621 in the latch control part 62 is Low, and an output signal φHOLD of the latch control part 62 is Low, the latch circuits L_0 to L_6 are in the disable state and have stopped operation. Since an output signal φHOLD_7 of the latch control part 62 is High, the latch circuit L_7a is in the enable state, and outputs the output signal φCK7 of the delay unit DU[7] as it is from an output terminal M as the output signal.

At this time, since an output signal φRS (=the output signal φCO of the comparison circuit 621) of the latch control part 62 is Low, logic elements (a NAND circuit NAND1 and an INV circuit INV2) of the latch circuit L_7a have stopped operation. A counter circuit 64 performs a count operation based on the output signal φCK7 of the delay part 71 that is output from the output terminal M of the latch circuit L_7a. In this count operation, the count value increases or decreases with rise or decay of the output signal φCK7.

While a signal voltage in accordance with a ramp wave φRamp is higher than a signal voltage in accordance with a pixel signal φSignal after the first timing, the output signal φCO of the comparison circuit 621 in the latch control part 62 is Low. When the signal voltage in accordance with the ramp wave φRamp becomes equal to or lower than the signal voltage in accordance with the pixel signal φSignal, the output signal φCO of the comparison circuit 621 in the latch control part 62 becomes High. A period of time from the first timing until the output signal φCO of the comparison circuit 621 in the latch control part 62 becomes High is a time interval that becomes a target for detection. A number of the start pulse φStartP passing through the delay units DU[0] to DU[7] constituting the delay part 71 during this time period is a number in accordance with a level of the pixel signal φSignal.

After the time interval, which becomes the detection target, elapses from the first timing, the output signal φCO of the comparison circuit 621 in the latch control part 62 is inverted, such that the output signal φHOLD of the latch control part 62 becomes High (second timing). In this way, the latch circuits L_0 to L_6 are placed in the enable state. At this time, the output signal φRS of the latch control part 62 (the output signal φCO of the comparison circuit 621) becomes High. In this way, the logic elements (the NAND circuit NAND1 and the INV circuit INV2) of the latch circuit L_7a start operation.

After a time that coincides with a delay time of an inverting delay circuit 622 in the latch control part 62 elapses from the second timing (third timing), an output signal φxCO_D of the inverting delay circuit 622 in the latch control part 62 is inverted, such that the output signal φHOLD of the latch control part 62 becomes Low. In this way, the latch circuits L_0 to L_6 are placed in the disable state. At this time, logic states in accordance with the output signals φCK0 to φCK6 of the delay units DU[0] to DU[6] are latched in the latch circuits L_0 to L_6 of the latch part 63.

At this time, the output signal φHOLD_7(φxCO_D) of the latch control part 62 becomes Low, and the switch circuit SW1 of the latch circuit L_7a turns OFF, such that the latch circuit L_7a is placed in the disable state. After a time in accordance with a delay time of the SW control part 31 in the latch circuit L_7a elapses from the third timing (fourth timing), the switch circuit SW2 in the latch circuit D_7 turns ON. For this reason, the latch circuit L_7a latches a logic state in accordance with the output signal φCK7 of the delay unit DU[7]. In addition, between the third timing and the fourth timing, the latch circuit L_7a have latched a logic state in accordance with the output signal φCK7 of the delay unit DU[7] in parasitic capacitance such as gate capacitance of the NAND circuit NAND1, and the like.

The latch circuit L_7a stops operation, and thus the counter circuit 64 latches a count value.

From the logic states held by the latch part 63 and the count value held by the counter circuit 64, data corresponding to the time interval is obtained.

After that, the digital data latched by the latch circuits L_0 to L_7a and the counter circuit 64 is output through a horizontal signal line by a horizontal scanning circuit 9, and transmitted to an encoder circuit 8. The encoder circuit 8 performs a binarization process, and thus binary data is obtained. Here, the encoder circuit 8 may be built in the A/D conversion circuit 6.

In the aforementioned operation, since the logic elements (inverter circuits INV1 and INV2, and the NAND circuit NAND1) of the latch circuits L_0 to L_6 and L_7a operate only for a period of time from the second timing (control signal output timing) to the third timing (latch timing), it is possible to reduce power consumption of the latch part 63. Consequently, according to this embodiment, it is possible to implement a solid-state imaging device with reduced power consumption.

In the aforementioned operation, a voltage of an output terminal Q of the latch circuit L_7a varies at a timing at which a time in accordance with a delay time of the logic elements (the NAND circuit NAND1 and the INV circuit INV2) of the latch circuit L_7a elapses after a voltage of the output terminal M of the latch circuit L_7a varies. For this reason, as shown in FIG. 8, the voltage of the output terminal Q of the latch circuit L_7a and the voltage of the output terminal M are different at the third timing.

Figure 9:
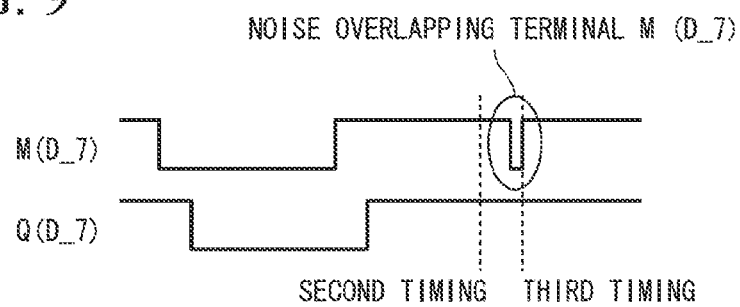
FIG. 9 is a timing chart illustrating noise generated in the A/D conversion circuit of a solid-state imaging device according to the second embodiment of the present invention.

At this time, when connections of the switch circuit SW1 and the switch circuit SW2 of the latch circuit L_7a are simultaneously switched, noise shown in FIG. 9 overlaps the voltage of the output terminal M. When the counter circuit 64 makes a miscount based on the noise, an error of an upper 1 bit occurs in an A/D conversion result. In this embodiment, the switch circuit SW1 switches a connection, and then the switch circuit SW2 switches a connection at the timing at which the time in accordance with the delay time of the SW control part 31 elapses. For this reason, as shown in FIG. 9, it is possible to remove the noise that overlaps an input signal of the counter circuit 64 due to a switching operation of the latch circuit L_7. Consequently, according to this embodiment, it is possible to realize a reduction in power consumption and also to implement a highly-precise A/D conversion process.

A configuration of the latch circuits L_0 to L_6 in the A/D conversion circuit 6 is not limited to the configuration of FIG. 4A, and may be a circuit that latches an input signal of the input terminal D according to an input signal of the input terminal CK. Also, the configuration of the latch circuit L_7a is not limited to the configuration of FIG. 7, and may be a configuration in which a NOR circuit is employed instead of a NAND circuit.

Third Embodiment

Figure 10:
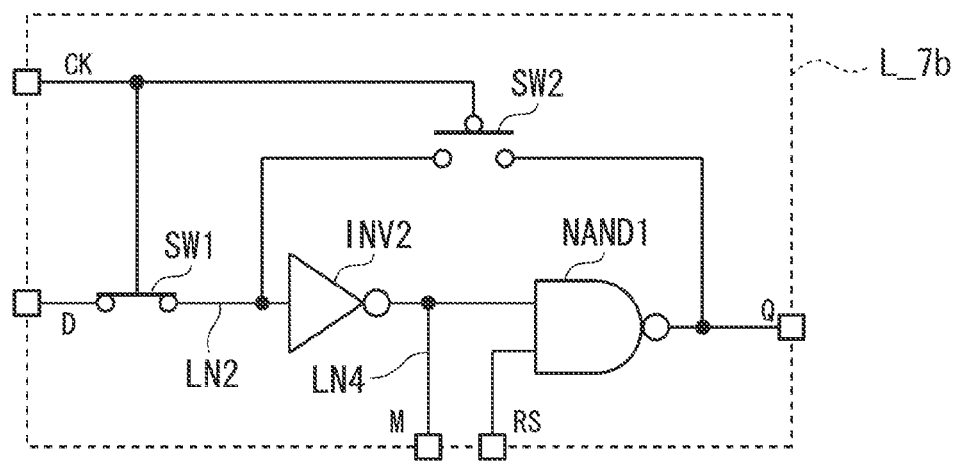
FIG. 10 is a circuit diagram showing a configuration of a latch circuit of an A/D conversion circuit that a solid-state imaging device according to a third embodiment of the present invention.

Next, a third embodiment of the present invention will be described. FIG. 10 shows a configuration of a latch circuit L_7 (latch circuit L_7b) of an A/D conversion circuit 6 according to this embodiment. Since this embodiment is the same as the first embodiment except for the configuration of the latch circuit L_7b constituting the A/D conversion circuit 6, a description will be omitted.

The latch circuit L_7b shown in FIG. 10 differs from the latch circuit L_7 shown in FIG. 4B in the following respects. Dispositions of the INV circuit INV2 and the NAND circuit NAND1 have been changed. Also, the signal line LN4 (signal output line) that connects the output terminal of the INV circuit INV2 and the first input terminal of the NAND circuit NAND1 is connected to the output terminal M. Except for these, the configuration is the same as the configuration of the latch circuit L_7 shown in FIG. 4B.

When an input signal of the input terminal CK is High, the latch circuit L_7b is placed in the enable state, and outputs a signal that is obtained by inverting an input signal of the input terminal D through the INV circuit INV2 from the output terminal M as an output signal.

Here, when the input signal of the input terminal CK switches from High to Low, the latch circuit L_7b is placed in the disable state, and latches a logic state of the input signal of the input terminal D. The latched input signal is output from the output terminal Q as an output signal. Also, when an input signal of the input terminal RS becomes Low, the NAND circuit NAND1 stops operation.

When the input signal of the input terminal CK is High, a switch circuit SW1 turns ON, such that a signal obtained by inverting the output signal φCK7 of the delay unit DU[7] in the delay part 71 through the INV circuit INV2 is input to the first input terminal of the NAND circuit NAND1 and is also output to the counter circuit 64 from the output terminal M. At this time, by determining the input signal of the input terminal RS input to the second input terminal of the NAND circuit NAND1 to be Low, even if the signal obtained by inverting the output signal φCK7 of the delay unit DU[7] is input to the NAND circuit NAND1, operation of the NAND circuit NAND1 can be stopped, and power consumption can be reduced.

Since operation of the A/D conversion circuit 6 according to this embodiment is the same as that of the first embodiment except for operation of the latch circuit L_7b, a description will be omitted. In this embodiment, the logic elements (the inverter circuits INV1 and INV2) of the latch circuits L_0 to L_6 and the NAND circuit NAND1 of the latch circuit L_7b have stopped operation for a period of time from the first timing to the second timing shown in FIG. 5. Consequently, it is possible to reduce power consumption of the latch part 63.

In addition, in this embodiment, an output side of the INV circuit INV2 in the latch circuit L_7b is connected to the counter circuit 64, and the signal line LN2 that transmits the output signal φCK7 of the delay unit DU[7] and the signal line LN4 connected to the counter circuit 64 are separated by the INV circuit INV2. Thus, load of the signal line LN2 in this embodiment is lighter than that in the first embodiment. For this reason, corruption of a waveform can be suppressed, and a highly-precise A/D conversion process can be implemented. Consequently, according to this embodiment, it is possible to realize a reduction in power consumption and also to implement a highly-precise A/D conversion process.

A configuration of the latch circuit L_7b is not limited to the configuration of FIG. 10, and may be a configuration in which a NOR circuit is employed instead of a NAND circuit.

Fourth Embodiment

Figure 11:
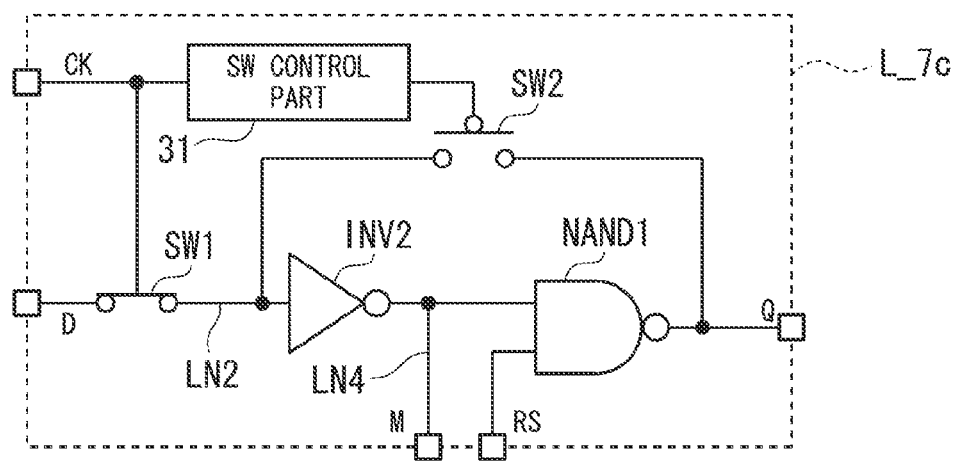
FIG. 11 is a circuit diagram showing a configuration of a latch circuit of an A/D conversion circuit of a solid-state imaging device according to a fourth embodiment of the present invention.

Next, a fourth embodiment of the present invention will be described. FIG. 11 shows a configuration of a latch circuit L_7 (latch circuit L_7c) of an A/D conversion circuit 6 according to this embodiment. Since this embodiment is the same as the second embodiment except for the configuration of the latch circuit L_7c constituting the A/D conversion circuit 6, a description will be omitted.

The latch circuit L_7c shown in FIG. 11 differs from the latch circuit L_7a shown in FIG. 7 in the following respects. That is to say, dispositions of the INV circuit INV2 and the NAND circuit NAND1 have been changed. Also, the output terminal M is connected to an output side of the INV circuit INV2. Except for these, the configuration is the same as the configuration of the latch circuit L_7a shown in FIG. 7.

Since operation of the A/D conversion circuit 6 according to this embodiment is the same as that of the second embodiment except for operation of the latch circuit L_7c, a description will be omitted. In this embodiment, the logic elements (the inverter circuits INV1 and INV2) of the latch circuits L_0 to L_6 and the NAND circuit NAND1 of the latch circuit L_7c have stopped operation for a period of time from the first timing to the second timing shown in FIG. 8. Consequently, it is possible to reduce power consumption of the latch part 63.

In addition, in this embodiment, the output side of the INV circuit INV2 in the latch circuit L_7c is connected to the counter circuit 64, and the signal line LN2 that transmits the output signal φCK7 of the delay unit DU[7] and the signal line LN4 connected to the counter circuit 64 are separated by the INV circuit INV2. Thus, load of the signal line LN2 in this embodiment is lighter than that in the second embodiment. For this reason, corruption of a waveform can be suppressed, and a highly-precise A/D conversion process can be implemented. Consequently, according to this embodiment, it is possible to realize a reduction in power consumption and also to implement a highly-precise A/D conversion process.

A configuration of the latch circuit L_7c is not limited to the configuration of FIG. 11, and may be a configuration in which a NOR circuit is employed instead of a NAND circuit.

Fifth Embodiment

Figure 12:
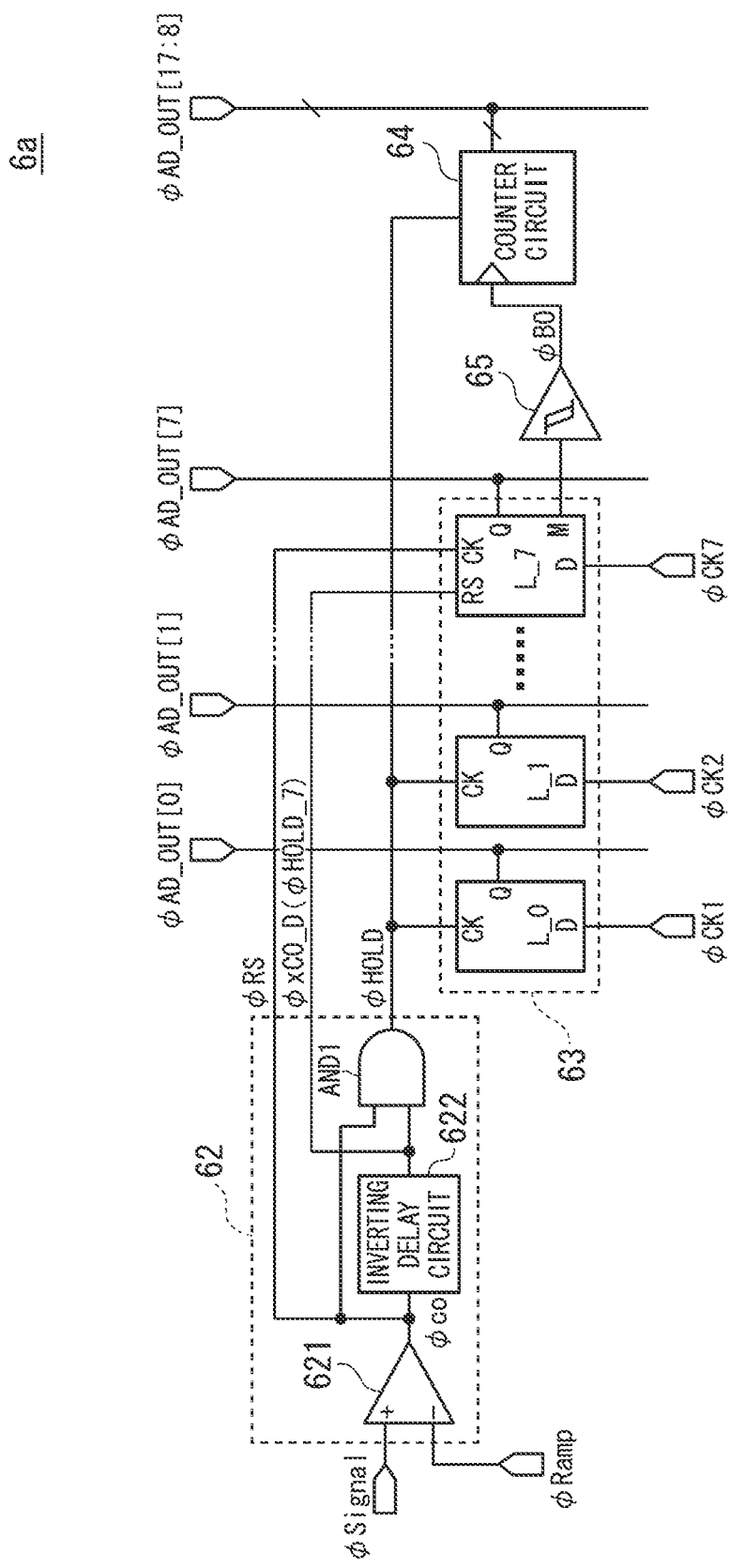
FIG. 12 is a block diagram showing a configuration of an A/D conversion circuit of a solid-state imaging device according to a fifth embodiment of the present invention.

Next, a fifth embodiment of the present invention will be described. FIG. 12 shows a configuration of an A/D conversion circuit 6 (A/D conversion circuit 6a) according to this embodiment. Since this embodiment is the same as the first embodiment except for the configuration of the A/D conversion circuit 6a, a description thereof will be omitted here.

In the A/D conversion circuit 6a shown in FIG. 12, a hysteresis buffer 65 having a hysteresis characteristic is installed between an input terminal of a counter circuit 64 and an output terminal M of a latch circuit L_7. Except for this, the configuration is the same as the configuration of the A/D conversion circuit 6 of the first embodiment. The hysteresis buffer 65 outputs an output signal φBO from which noise that overlaps an output signal of the latch circuit L_7 has been removed to the counter circuit 64.

Figure 13:
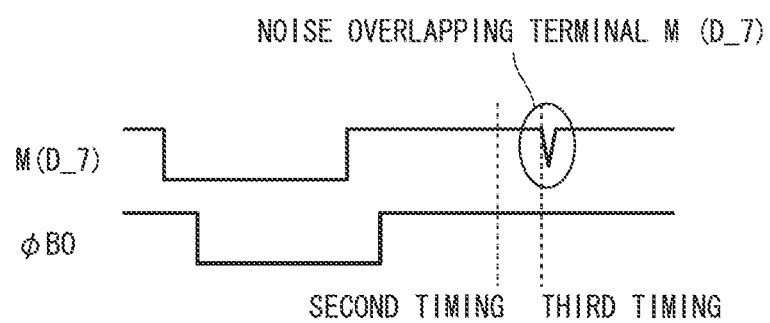
FIG. 13 is a timing chart illustrating noise generated in the A/D conversion circuit of a solid-state imaging device according to the fifth embodiment of the present invention.

Except for operation of the latch circuit L_7 and the counter circuit 64 at the third timing of FIG. 5, since operation of the A/D conversion circuit 6a according to this embodiment is the same as that of the first embodiment, a description will be omitted. FIG. 13 shows a voltage of the output terminal M of the latch circuit L_7 and a voltage of the output signal φBO of the hysteresis buffer 65. It is considered that, when the latch circuit L_7 latches a logic state of the output signal φCK of the delay unit DU[7] at the third timing, noise resulting from a switching operation of the latch circuit L_7 overlaps the voltage of the output terminal M of the latch circuit L_7. At this time, the hysteresis buffer 65 receives a signal that the noise overlaps, removes the noise, and outputs the output signal φBO to the counter circuit 64. Thus, in this embodiment, the counter circuit 64 does not miscount the noise resulting from the switching operation of the latch circuit L_7, and a highly-precise A/D conversion process can be implemented. Consequently, according to this embodiment, it is possible to realize a reduction in power consumption and also to implement a highly-precise A/D conversion process.

A configuration of the latch circuit L_7 is not limited to the configuration shown in FIG. 4B, and may be a configuration in which the SW control part 31 is installed as shown in FIG. 7, a configuration in which dispositions of the INV circuit INV2 and the NAND circuit NAND1 are changed and the output terminal M is connected to an output side of the INV circuit INV2 as shown in FIG. 10, or a configuration in which the configurations of FIG. 7 and FIG. 10 are combined as shown in FIG. 11.

In this embodiment, a hysteresis buffer operates to output a signal having the same phase as an input signal, but may invert and output the input signal without being limited to this.

Sixth Embodiment

Figure 14:
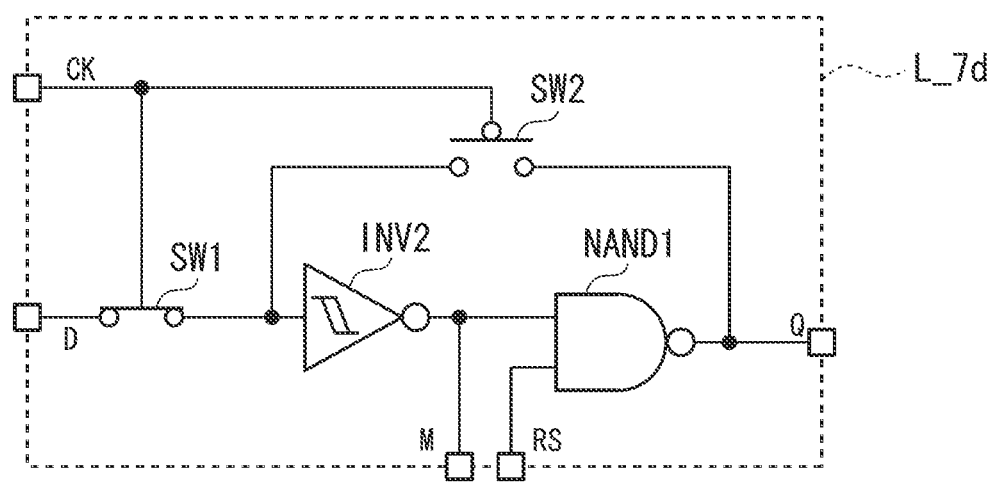
FIG. 14 is a circuit diagram showing a configuration of a latch circuit of an A/D conversion circuit of a solid-state imaging device according to a sixth embodiment of the present invention.
Figure 15:
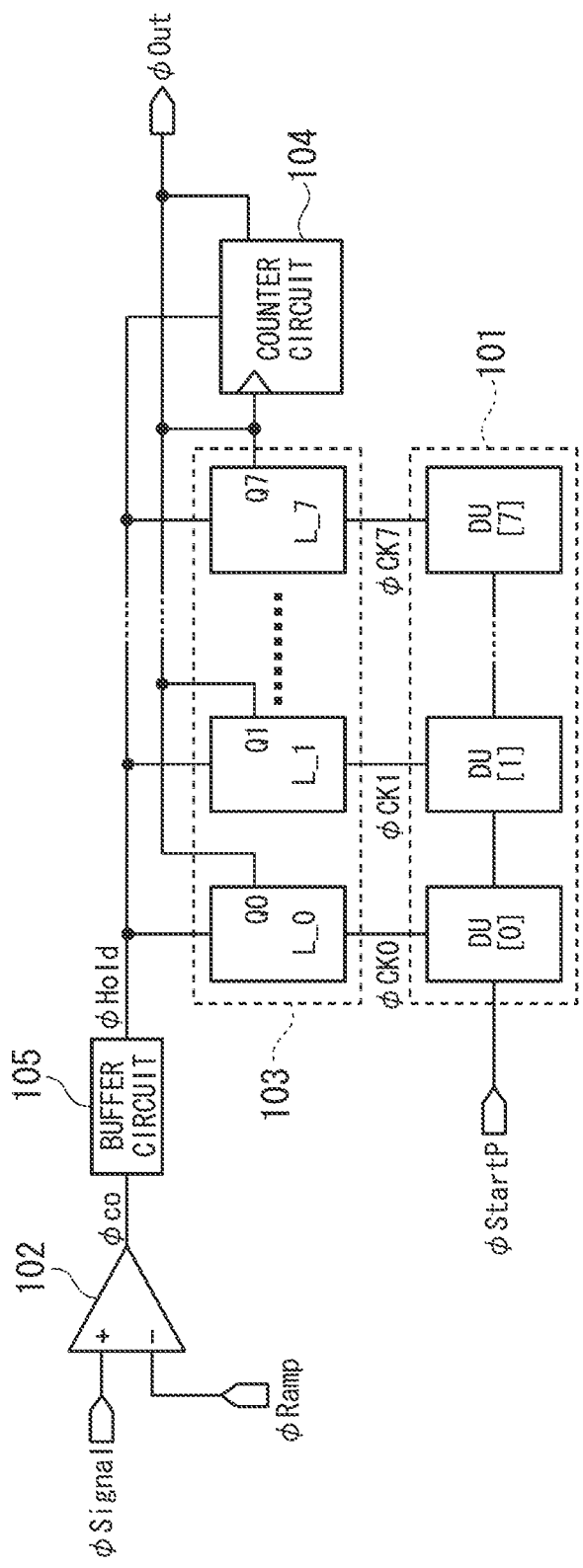
FIG. 15 is a block diagram showing a configuration of an A/D conversion circuit according to an existing example.
Figure 16:
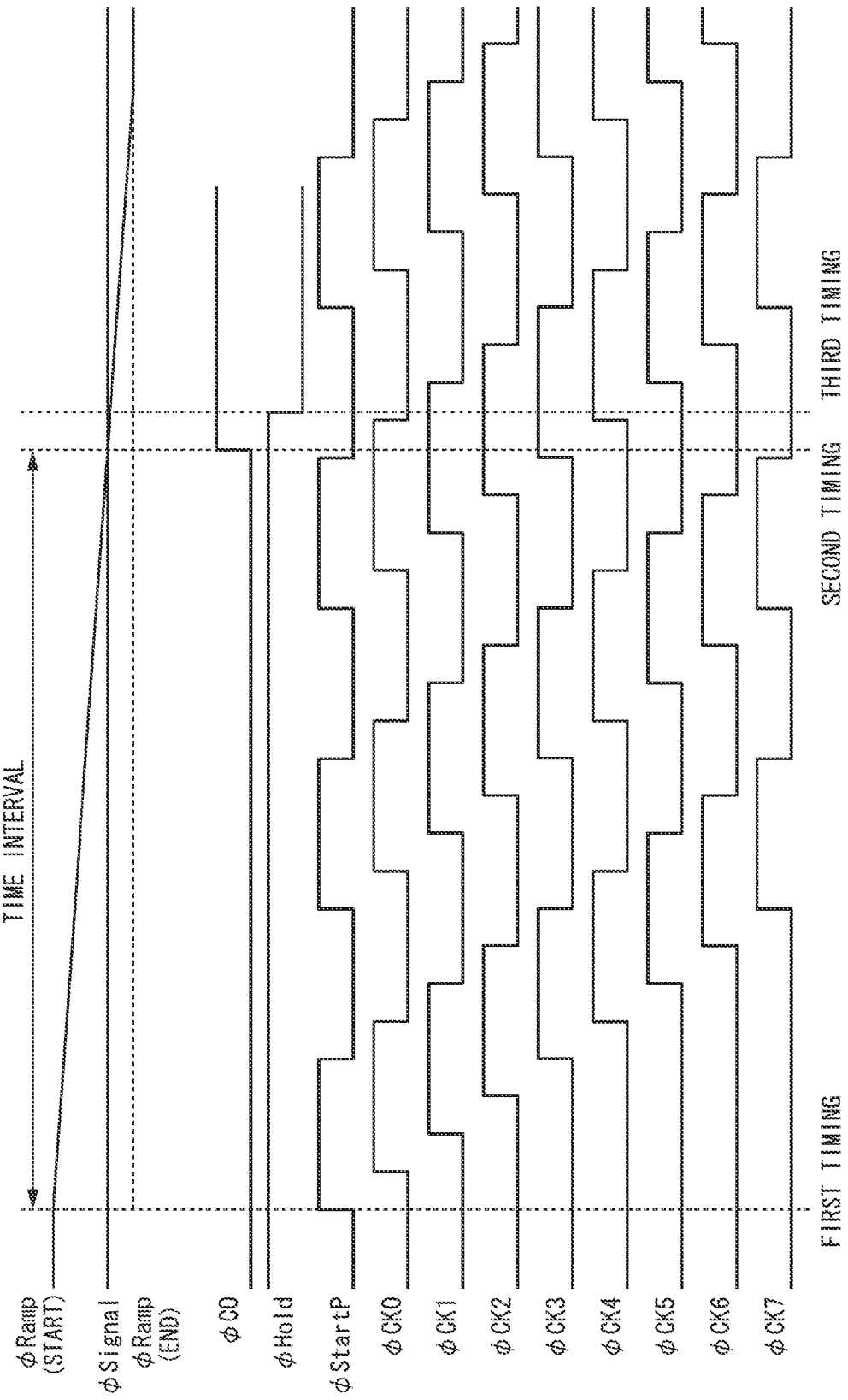
FIG. 16 is a timing chart illustrating operation of the A/D conversion circuit according to the existing example.

Next, a sixth embodiment of the present invention will be described. FIG. 14 shows a configuration of a latch circuit L_7 (latch circuit L_7d) of an A/D conversion circuit 6 according to this embodiment. Since this embodiment is the same as the first embodiment except for configurations of the latch circuit L_7d constituting the A/D conversion circuit 6 and the counter circuit 64, a description thereof will be omitted here.

The latch circuit L_7d differs from the latch circuit L_7 of FIG. 4B in the following respects. That is to say, dispositions of the INV circuit INV2 and the NAND circuit NAND1 have been changed, and the INV circuit INV2 has a hysteresis characteristic. Also, the output terminal M is connected to an output side of the INV circuit INV2. Except for these, the configuration is the same as the configuration of the latch circuit L_7 shown in FIG. 4B. The counter circuit 64 of this embodiment is configured to perform counting at a reverse switching timing with respect to the counter circuit 64 of the first embodiment. For example, when the counter circuit 64 of the first embodiment is configured to perform counting at a rise of the output signal φCK7 of the delay part 71, the counter circuit 64 of this embodiment performs counting at a decay of the output signal φCK7 of the delay part 71, and when the counter circuit 64 of the first embodiment is configured to perform counting at a decay of the output signal φCK7 of the delay part 71, the counter circuit 64 of this embodiment performs counting at a rise of the output signal φCK7 of the delay part 71.

Since operation of the A/D conversion circuit 6 according to this embodiment is the same as that of the first embodiment except for operation of the latch circuit L_7d, a description thereof will be omitted here. In this embodiment, the logic elements (the inverter circuits INV1 and INV2) of the latch circuits L_0 to L_6 and the NAND circuit NAND1 of the latch circuit L_7d have stopped operation for a period of time from the first timing to the second timing shown in FIG. 5. Consequently, it is possible to reduce power consumption of the latch part 63.

In this embodiment, an output signal of the INV circuit INV2 having a hysteresis characteristic is input to the counter circuit 64. For this reason, the counter circuit 64 does not make a miscount due to noise resulting from a switching operation of the latch circuit L_7d, and can implement a highly-precise A/D conversion process. Consequently, according to this embodiment, it is possible to realize a reduction in power consumption and also to implement a highly-precise A/D conversion process. Furthermore, in this embodiment, the logic element (INV circuit INV2) of the latch circuit L_7d has a hysteresis characteristic, such that the hysteresis buffer 65 can be removed in comparison with the A/D conversion circuit 6a of the fifth embodiment. For this reason, it is possible to reduce the power consumption of the A/D conversion circuit 6 than that of the A/D conversion circuit 6a of the fifth embodiment.

Here, a configuration of the latch circuit L_7d is not limited to the configuration shown in FIG. 14, and may be a configuration in which a NOR circuit is employed instead of a NAND circuit.

Although embodiments of the present invention have been described in detail above with reference to the drawings, detailed configurations are not limited to the embodiments but include a modification in design and the like within a scope that does not depart from the spirit of the present invention. For example, in FIG. 1, an A/D conversion circuit 6 is disposed to correspond to one column of unit pixels 1 in the pixel array 2, but may be disposed to each of a plurality of columns, such that a plurality of columns may share one A/D conversion circuit 6. The present invention is not limited to the description above, and is limited only by the scope of the appended claims.

What is claimed is:
1. A solid-state imaging device comprising:
    a pixel part in which a plurality of pixels outputting a pixel signal according to an intensity of an input electromagnetic wave are arranged in a shape of a matrix;
    a delay part which has a plurality of delay units delaying and outputting an input signal;
    a count part which performs counting based on a clock output from any one of the plurality of delay units, and latches a count result;
    a latch control part which outputs a control signal at a timing at which a number of the input signal passing through the plurality of delay units becomes a number in accordance with a level of the pixel signal; and
    a latch part which latches a logic state of an output signal of any one of the plurality of delay units,
    wherein the latch part includes:
    a first logic gate which is connected to the one of the plurality of delay units, and performs a logical operation on the output signal of the one of the plurality of delay units;
    a second logic gate which stops until the control signal output timing at which the control signal is output, and performs a logical operation on an output signal of the first logic gate and outputs a result of the logical operation to the first logic gate after the control signal output timing;
    a signal output line which connects an input terminal or an output terminal of the first logic gate with the count part; and a switch circuit which outputs the output signal of the one of the plurality of delay units to the count part through the signal output line until the control signal output timing, and switches a connection at a latch timing after a predetermined time elapses from the control signal output timing such that the first logic gate and the second logic gate latch the logic state of the output signal of the one of the plurality of delay units, and wherein the count part, the latch control part, and the latch part are disposed in each column or every a plurality of columns of pixels constituting the pixel part.

2. The solid-state imaging device according to claim 1,
wherein the first logic gate is constituted by a NAND circuit and stops until the control signal output timing,
wherein the second logic gate is constituted by an inverter circuit, and
wherein the signal output line is connected to the input terminal of the first logic gate.

3. The solid-state imaging device according to claim 1,
wherein the first logic gate is constituted by an inverter circuit,
wherein the second logic gate is constituted by a NAND circuit, and
wherein the signal output line is connected to the output terminal of the first logic gate.

4. The solid-state imaging device according to claim 1,
wherein the first logic gate is constituted by a NOR circuit and stops until the control signal output timing,
wherein the second logic gate is constituted by an inverter circuit, and
wherein the signal output line is connected to the input terminal of the first logic gate.

5. The solid-state imaging device according to claim 1,
wherein the first logic gate is constituted by an inverter circuit,
wherein the second logic gate is constituted by a NOR circuit, and
wherein the signal output line is connected to the output terminal of the first logic gate.

6. The solid-state imaging device according to claim 1,
wherein the switch circuit includes:
a first switch of which one end is connected to an input terminal of the latch part and of which the other end is connected to the input terminal of the first logic gate; and
a second switch of which one end is connected to the input terminal of the first logic gate and of which the other end is connected to an output terminal of the second logic gate.

7. The solid-state imaging device according to claim 6,
wherein the switch circuit further comprising:
a switch control circuit which controls the second switch to connect the input terminal of the first logic gate with the output terminal of the second logic gate a predetermined time after the first switch opens a connection between the input terminal of the latch part and the input terminal of the first logic gate.

8. The solid-state imaging device according to claim 1, further comprising:
a buffer having a hysteresis characteristic between an output terminal of the latch part and an input terminal of the count part.

9. The solid-state imaging device according to claim 3,
wherein the inverter circuit has a hysteresis characteristic.

10. The solid-state imaging device according to claim 5,
wherein the inverter circuit has a hysteresis characteristic.

* * * * *